(12) United States Patent
Campbell

(10) Patent No.: US 7,012,315 B1
(45) Date of Patent: Mar. 14, 2006

(54) FRAME SCALE PACKAGE USING CONTACT LINES THROUGH THE ELEMENTS

(75) Inventor: Scott Patrick Campbell, Thousand Oaks, CA (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 10/003,821

(22) Filed: Oct. 31, 2001

Related U.S. Application Data

(60) Provisional application No. 60/245,085, filed on Nov. 1, 2000.

(51) Int. Cl.
*H01L 31/0203* (2006.01)

(52) U.S. Cl. .................... 257/433; 257/434
(58) Field of Classification Search ............ 257/704, 257/433, 434; 438/64
See application file for complete search history.

(56) References Cited

U.S. PATENT DOCUMENTS

| | | | | |
|---|---|---|---|---|
| 4,761,518 A | * | 8/1988 | Butt et al. ............ | 174/52.4 |
| 5,291,038 A | * | 3/1994 | Hanamoto et al. ...... | 257/82 |
| 5,302,852 A | * | 4/1994 | Kaneda et al. ........ | 257/704 |
| 5,477,081 A | * | 12/1995 | Nagayoshi ............ | 257/678 |
| 5,821,457 A | * | 10/1998 | Mosley et al. ........ | 174/52.4 |
| 5,821,532 A | * | 10/1998 | Beaman et al. ........ | 250/239 |
| 6,297,540 B1 | * | 10/2001 | Assadi et al. ........ | 257/432 |
| 6,313,525 B1 | * | 11/2001 | Sasano ............... | 257/704 |
| 6,403,881 B1 | * | 6/2002 | Hughes ............... | 174/52.3 |
| 6,437,412 B1 | * | 8/2002 | Higuchi et al. ....... | 257/416 |
| 6,455,925 B1 | * | 9/2002 | Laureanti ............ | 257/678 |
| 6,475,824 B1 | * | 11/2002 | Kim .................. | 438/66 |
| 6,489,670 B1 | * | 12/2002 | Peterson et al. ...... | 257/686 |
| 6,495,895 B1 | * | 12/2002 | Peterson et al. ...... | 257/434 |
| 6,645,783 B1 | * | 11/2003 | Brunner et al. ....... | 438/26 |
| 6,674,159 B1 | * | 1/2004 | Peterson et al. ...... | 257/680 |
| 6,696,738 B1 | * | 2/2004 | Tu et al. ............ | 257/433 |
| 6,707,125 B2 | * | 3/2004 | Harazono ............. | 257/434 |
| 6,774,447 B2 | * | 8/2004 | Kondo et al. ......... | 257/432 |

FOREIGN PATENT DOCUMENTS

JP         406151977 A  *  5/1994 ............ 257/99

* cited by examiner

*Primary Examiner*—David A. Zarneke
(74) *Attorney, Agent, or Firm*—Dickstein Shapiro Morin & Oshinsky LLP

(57) ABSTRACT

A package for an integrated circuit contacting device which is shaped like a frame. A portion of the contacting device may be bonded to the printed circuit board, and includes leads which extend along in outer surface thereof, from an outside edge of the package to a downward facing surface of the package which faces an integrated circuit die. The package may be in dented in the shape of the die, and may also include indentations allowing a lid and/or a back portion to be located thereon. In an embodiment, a lens amounts may also be used.

17 Claims, 2 Drawing Sheets

FRAME SCALE PACKAGE USING CONTACT LINES THROUGH THE ELEMENTS

CROSS-REFERENCE TO RELATED APPLICATIONS

The present application claims priority from provisional application No. 60/245,085, filed Nov. 1, 2000.

BACKGROUND

Many different systems are known for packaging integrated circuits. Standard packages come by many different names. However, many of these packages have the same object: to package an active part of an integrated circuit, a "die", in a way that protects the die, but also allows electrical communication to and from the die.

SUMMARY

The present application teaches a frame scale package which may hold the die around its edges and effectively frames the die. The system may have significant advantages, including better protection of the die against the environment.

BRIEF DESCRIPTION OF THE DRAWINGS

These and other aspects will now be described in detail with respect to the accompanying drawings wherein.

DETAILED DESCRIPTION

Figure 1A:
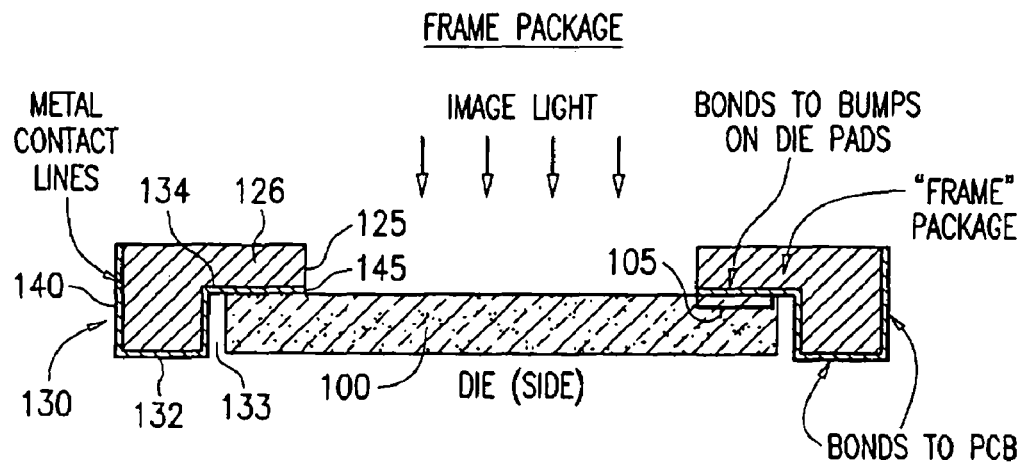
FIGS. 1A and 1B show respective side and top views of a first embodiment of a basic frame package for an image sensor.
Figure 1B:
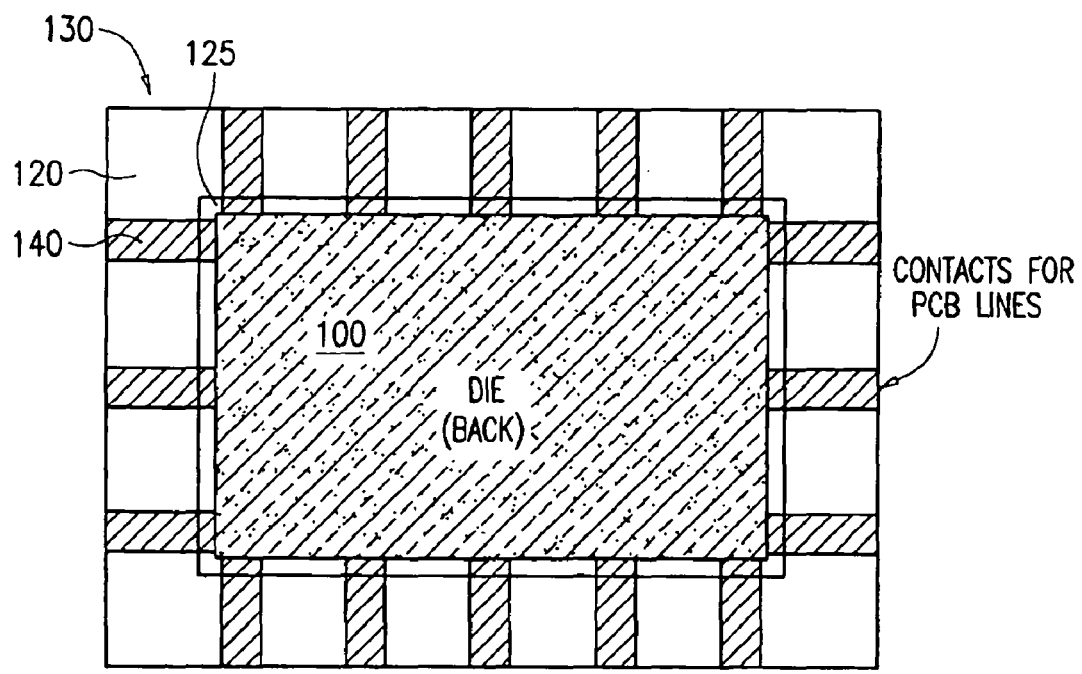

FIGS. 1A and 1B show a first embodiment of the frame scale package. FIG. 1a shows the side view, showing the die element 100, which is an integrated circuit with an image sensor element integrated thereon. Preferably, the image sensor element is an active pixel sensor, of the type described in U.S. Pat. No. 5,471,215. As conventional, the die 100 includes contact portions 105 along an outer edge thereof, which enable electrical connection to the circuitry on the die. Electrical connection includes connections for power and signals.

The frame package is formed by an outer package element 120 which has an inner perimeter area 125 that is "stepped", which is to say that it has a first portion 126 which is slightly smaller than the die outer perimeter, and a thinned portion, where the thickness is reduced so that it can connect to the outer edges of the die. The outer perimeter 130 has a greater thickness than the inner perimeter, again with the difference in thicknesses being sufficient to accommodate the thickness of the die.

The outer surface of the frame includes a plurality of metal contact lines 140. The metal contact lines 140 may extend, as shown in FIG. 1A and FIG. 1B, from the outer perimeter 130 of the frame, along the bottom surface of the frame 132, along the step portion 133 of the inner perimeter of the frame, and along the bottom surface 134 of the inner portion of the frame. A connection 145 to the die 100 may be made at the location where the contact extends along the inner portion of the frame. The outer perimeter 140 also has a metal contact line, enabling a contact to be made at that frame package location.

The frame package may also be bonded to the printed circuit board along either or both of the surfaces 130, 132.

FIG. 1B shows how a plurality of contact areas for the printed circuit board lines may be provided. While the figure shows only a few contacts being made, of course there may be many more contacts.

In operation, the frame package forms a structure like a frame around the rectangular die. The bond pads on the die may contact the leads on the package via direct soldering rather than wire bonding, analogous to the way that connections are carried out in flip chip bonded die mounting. The leads in the frame scale package may also be soldered directly to a printed circuit board.

In FIGS. 1A and 1B, an image sensor die 100 is placed face up into the package, and may fit snugly inside the inner perimeter of the package as shown. Since the package forms a frame around the die, portions of the package may contact the die at its outer edges. The die is prepared with solder bumps located on its bonded tabs in the areas 105.

Once the package is placed around the die, the system is heated to melt the solder bumps. This thereby bonds the die to the frame package leads. The leads of the package run from the die contacts, along the area on the underside of the package, and may also run out along the outer perimeter of the package for lead bonding to the printed circuit board.

Figure 2:
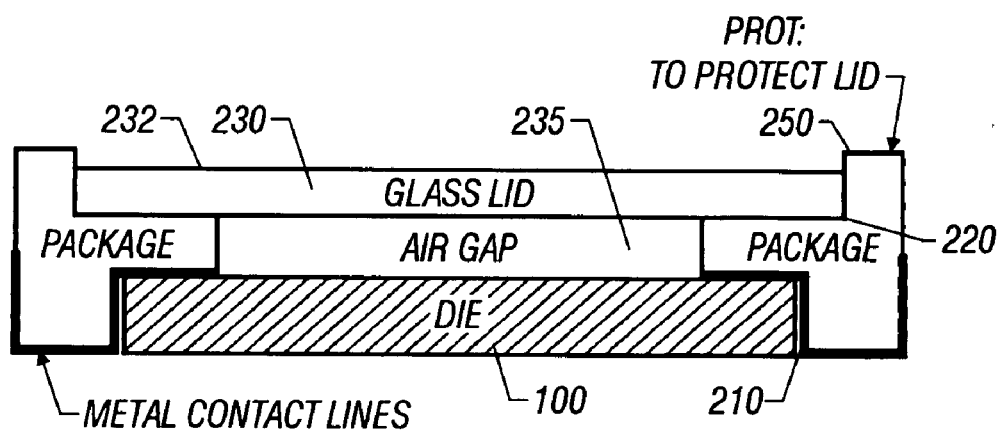
FIG. 2 shows a frame package side view with a lid.

Other embodiments may provide other structures that associate with and protect or work with the die. The FIG. 2 embodiment includes a similar package which includes flanges on the frame package; not only at its bottom portion 210, but also at the top portion 220. The top frame 220 may receive a glass lid 230 which is separated from the die 100 by an air gap shown as 235. A protuberance 250 is a spot where the frame scale package extends above the level of the lid. This may be done to prevent the operative optical surface 232 of the lid from being scratched. The glass lid may be bonded to the lid in conventional ways, such as with a silicon sealant.

Figure 3:
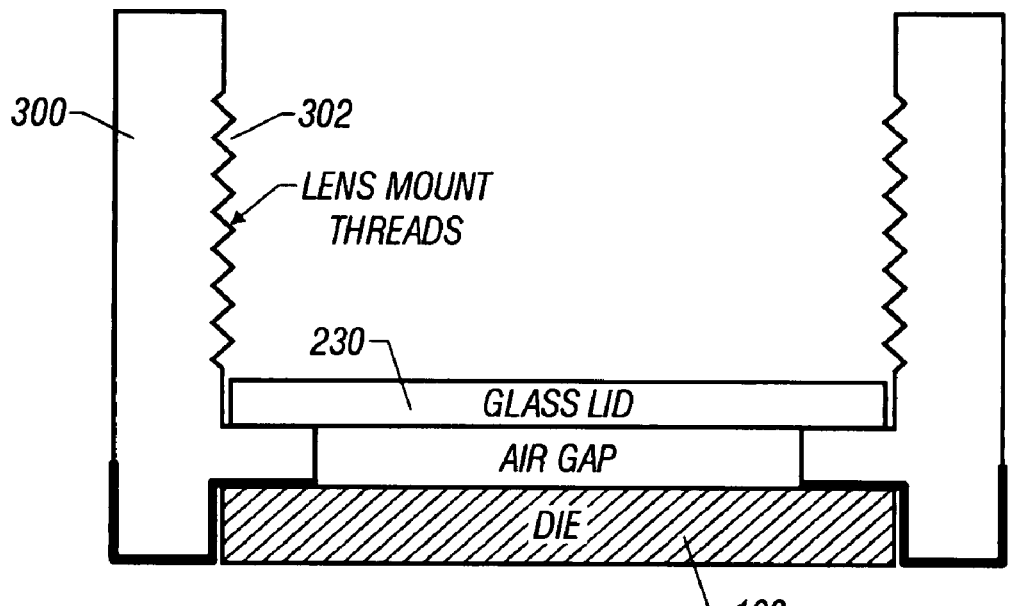
FIG. 3 shows a frame package with lid and having a lens mount.

FIG. 3 shows an alternative frame package which includes an additional threaded area 300 above the die 100 and glass lid 230. The additional area 300 has inner threads, which are threaded to accept a lens 340. In this way, a lens may be mounted within the package, associated with the die. For example, this may enable focusing of certain incoming rays to the die. While this embodiment shows the inner surfaces as being threaded, it should be understood that other surface features could be used alternatively to hold the lens 340 in place.

Figure 4:
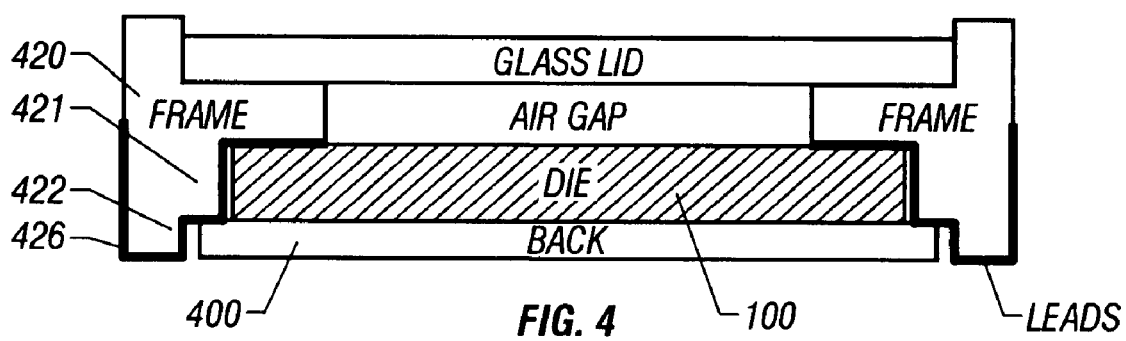
FIG. 4 shows a totally sealed frame scale package with a lead and rear portion.

FIG. 4 shows an alternative embodiment in which the frame scale package includes multiple indentations, one of which forms a backing portion for the die. The backing portion 400 is located behind the die 100. In this embodiment, the frame 420 includes a first indentation portion 422 which is sized to accept the backing portion 400. The second indentation portion 424 is sized to accept the die 100. The leads 426 are similar to those in the previous embodiment, but in addition, may travel along the two indented portions 422, 424. The back plate may allow better sealing of the die against the environment.

Although only a few embodiments have been disclosed in detail above, other modifications are possible. All such modifications are intended to be encompassed within the following claims.

What is claimed is:

1. A package for a rectangular integrated circuit, comprising:
   a frame defining an opening between a top surface and a bottom surface, said bottom surface including an indented area where a thickness between the top surface and the bottom surface is thinner than in a non indented area of said bottom surface, said frame being adapted to accept in said indented area an integrated circuit while preserving a portion of said opening between said indented area and said stop surface; and
   a contact portion, said contact portion extending along said bottom surface within said indented area, and along said bottom surface within said non indented area, said contact portion being adapted to connect to said integrated circuit at an edge thereof.

2. A package as in claim 1, wherein said package includes a connection portion, adapted for soldering to said integrated circuit.

3. A package as in claim 2, wherein said integrated circuit includes an image sensor, and a central portion of said frame defines a portion where image light can enter said image sensor.

4. A package as in claim 1, further comprising an element which allows sealing said integrated circuit relative to an environment of said package.

5. A package as in claim 3, further comprising a clear sealing element which allows sealing said integrated circuit relative to the environment.

6. A package as in claim 5, wherein said clear sealing element includes a glass lid.

7. A package as in claim 4, wherein said sealing element includes a lid portion on a top of the die and a backing portion on a rear portion of the die.

8. A package as in claim 7, wherein said indented area includes two separate sized indented areas, one sized to receive said die, and another sized to receive said backing portion.

9. A package as in claim 5, further comprising an element which protects said sealing element against damage.

10. A package as in claim 9, wherein said element which protects includes an extending part which extends above a top of said sealing element.

11. A package as in claim 3, further comprising an upper portion on said package, having surfaces adapted to accept a lens therein.

12. A package as in claim 11, wherein said surfaces include screw threads.

13. A package for an integrated circuit, comprising:
   a packaging portion having a frame defining an opening between a top surface and a bottom surface, said bottom surface comprising:
     a first bottom surface with an outer perimeter and an inner perimeter, said inner perimeter being disposed at an intersection of said first bottom surface with an inward facing surface, and
     a second bottom surface within said inner perimeter, said first bottom surface, said inward facing surface, and said second bottom surface mutually having a metal contact thereon, said metal contact being adapted to connect to an integrated circuit disposed within said inward facing surface while preserving a portion of said opening above said integrated circuit.

14. A package as in claim 13, further comprising an element which, in cooperation with said frame, seals said opening at the top surface, such that said package includes an open space between the element and the integrated circuit.

15. A package as in claim 14, wherein said element which seals is transparent.

16. A package as in claim 15, wherein said element is formed of glass, and is hermetically sealed around an area of said inner perimeter.

17. A package as in claim 16, further comprising a backing area, hermetically sealing a bottom portion, and wherein said metal contact is disposed around said bottom portion.

\* \* \* \* \*

UNITED STATES PATENT AND TRADEMARK OFFICE
CERTIFICATE OF CORRECTION

PATENT NO. : 7,012,315 B1  
APPLICATION NO. : 10/003821  
DATED : March 14, 2006  
INVENTOR(S) : Scott P. Campbell It is certified that error appears in the above-identified patent and that said Letters Patent is hereby corrected as shown below:

In the Abstract, the following error is corrected:

Line 4, "in outer" should read --an outer--.

In the Claims, the following error is corrected:

Claim 1, column 3, line 11, "stop" should read --top--.

Signed and Sealed this

Fourteenth Day of November, 2006

JON W. DUDAS  
*Director of the United States Patent and Trademark Office*

UNITED STATES PATENT AND TRADEMARK OFFICE
CERTIFICATE OF CORRECTION

PATENT NO.         : 7,012,315 B1  
APPLICATION NO. : 10/003821  
DATED                 : March 14, 2006  
INVENTOR(S)        : Scott P. Campbell Page 1 of 1

It is certified that error appears in the above-identified patent and that said Letters Patent is hereby corrected as shown below:

Item [57]  
In the Abstract, the following error is corrected:

Line 4, "in outer" should read --an outer--.

In the Claims, the following error is corrected:

Claim 1, column 3, line 11, "stop" should read --top--.

Signed and Sealed this

Twenty-sixth Day of December, 2006

JON W. DUDAS  
*Director of the United States Patent and Trademark Office*